United States Patent [19]

Bai

[11] Patent Number: 4,608,468

[45] Date of Patent: Aug. 26, 1986

[54] HERMETICALLY SEALED IMPACT SWITCH

[75] Inventor: Monty W. Bai, Scottsdale, Ariz.

[73] Assignee: Motorola, Inc., Schaumburg, Ill.

[21] Appl. No.: 686,360

[22] Filed: Dec. 26, 1984

[51] Int. Cl.4 ....................... H01H 35/14; H01L 41/08

[52] U.S. Cl. .......................... 200/61.45 R; 200/61.48; 200/61.51

[58] Field of Search ...................... 200/61.45 R-61.53, 200/83 N, 61.49; 310/329

[56] References Cited

U.S. PATENT DOCUMENTS

| | | | |
|---|---|---|---|
| 2,596,171 | 5/1952 | Rabinow | 200/83 N X |
| 2,997,557 | 8/1961 | Gillmor et al. | 200/61.45 M |
| 3,097,272 | 7/1963 | Hautly | 200/61.49 |
| 3,324,432 | 6/1967 | Ridler et al. | 200/83 N X |
| 3,538,232 | 11/1970 | Bachtig et al. | 310/329 X |
| 3,826,885 | 7/1974 | Allen et al. | 200/83 N X |

*Primary Examiner*—J. R. Scott

*Attorney, Agent, or Firm*—Raymond J. Warren

[57] ABSTRACT

An apparatus is disclosed providing a hermetically sealed impact switch that is non-critical to humidity and less susceptible to corrosion. The impact switch consists of a cover, a base, and a flexible beam disposed there between. Mounted in the cover and extending into a cavity created by the cover and flexible beam is a pair of contact pins, each electrically isolated from the cover and each other. Mounted to the flexible beam is a mass, which may be a piezoelectric crystal or the like. By utilizing a pair of pins, rather than one pin, the flexible beam may be mounted directly to the cover and base without an insulating bonding material which can cause corrosion of the contact pins.

1 Claim, 3 Drawing Figures

HERMETICALLY SEALED IMPACT SWITCH

BACKGROUND OF THE INVENTION

1. Field of the Invention

This invention relates, in general, to impact switches and, more particularly, to hermetically sealed beam type impact switches.

2. Background Art

An impact switch is a device used to detect contact with an exterior element. Upon impact of sufficient force, the switch is closed and the attached circuitry and/or device is activated (e.g. an air bag in an automobile). An impact switch is often used in an environment where it will sit idle for great lengths of time. This causes the contacting terminal to become corroded either from exterior elements (e.g. humidity) internal elements (e.g. the epoxy used to electrically isolate and bond the parts in the standard type of impact switch) resulting in a malfunctioning or nonfunctioning switch.

SUMMARY OF THE INVENTION

Accordingly, it is an object of the present invention to provide a hermetically sealed impact switch that will overcome the deficiencies described above.

A further object of the present invention is to provide a hermetically sealed impact switch that is protected from corrosion.

Still another object of the present invention is to provide a hermetically sealed impact switch that is sealed to prevent the entrance of adverse components.

The above and other objects and advantages of the present invention are provided by a hermetically sealed impact switch having a pair of contact pins extending through the outer housing of an impact switch. The present invention consists of a hermetically sealed impact switch having a cover, a base, and a flexible beam disposed therebetween. Mounted through the cover and extending into a cavity created by the cover and the flexible beam is a pair of contact pins; each electrically isolated from the cover and each other. Mounted to the flexible beam is a mass, which may be a piezoelectric crystal or the like. By utilizing a pair of contact pins, rather than one pin, the flexible beam may be mounted directly to the cover and base, without an insulating binding material which can cause corrosion of the contact points.

A particular embodiment of the hermetically sealed impact switch comprises: a plate; a flexible beam mounted on said plate; a cover mounted on said plate in overlying relationship to said flexible beam and including a portion spaced from said flexible beam to provide a hermetically sealed cavity for lateral movement of said flexible beam; and switch means for contacting said flexible beam, said switch means being disposed through said cover extending into said cavity and said contact means being electrically isolated from said cover.

DETAILED DESCRIPTION OF THE INVENTION

Figure 1:
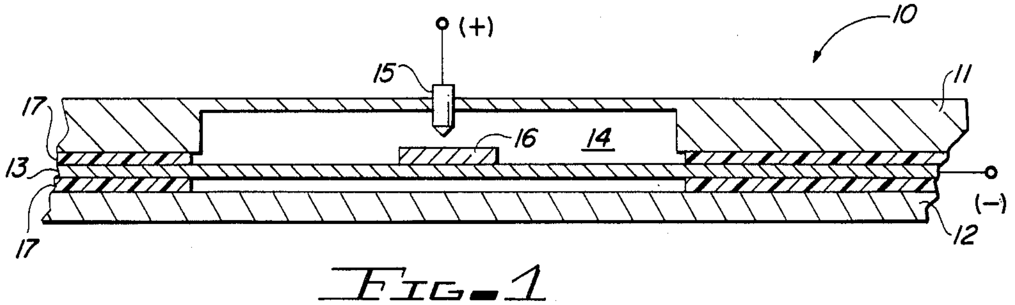
FIG. 1 is a cross-sectional view of an impact switch.

Referring to the diagram of FIG. 1, a cross-sectional view of an impact switch, generally designated 10, is illustrated. Switch 10 consists of a top cover 11; a bottom plate 12; and a flexible beam 13. Beam 13 is isolated from top cover 11 and bottom plate 12 by an isolating/bonding material 17, such as an epoxy or the like.

A cavity 14 is formed in switch 10 by top cover 11 and bottom 12. Extending through cover 11 and into cavity 14 is a pin 15. Mounted on beam 13 and extending into cavity 14 is a mass 16. Mass 16 is disposed such that when switch 10 contacts a foreign object beam 13 will flex and, if the force is great enough, mass 16 will contact pin 15.

This arrangement has beam 13 coupled to one end (−) of the switch and pin 15 coupled to the other end (+). This necessitates the use of the isolating/bonding material 17 in switch 10 to prevent beam 13 and pin 15 from being shorted together through cover 11. The isolating/bonding material 17, often an epoxy or the like, will release corrosive elements into cavity 14 which can cause pin 15 and/or mass 16 to corrode.

This problem is aggravated by the fact that these switches are often employed under circumstances where they will sit dormant for very long periods of time. This corrosion of the contact area can cause switch 10 to malfunction or not function at all.

Figure 2:
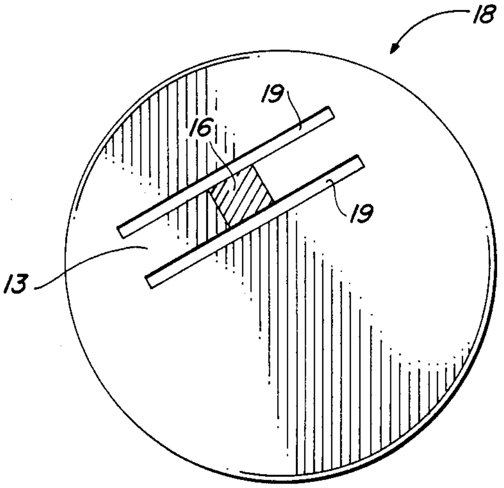
FIG. 2 is a top view of a portion of an impact switch.

Referring now to the diagram of FIG. 2, a top view of a portion of an impact switch, generally designated 18, is illustrated. Portion 18 contains beam 13 defined by a pair of parallel slots 19. Mass 16 is then attached to beam 13. When the impact switch containing portion 18 is impacted beam 13 will flex allowing mass 16 to contact a point on the cover (FIG. 1). FIGS. 1 and 2 are described in more detail in a co-pending application having Ser. No. 686,556 filed on the same date as the present application and assigned to the same assignee.

Figure 3:
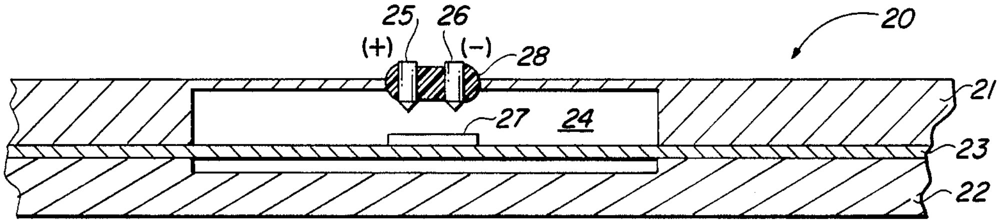
FIG. 3 is a cross-sectional view of an impact switch embodying the present invention.

Referring now to the diagram of FIG. 3, an impact switch, generally designated 20, is illustrated embodying the present invention. Switch 20 consists of a top cover 21, a bottom plate 22 and a flexible beam 23 located therebetween. Switch 20 has a cavity 24 defined by cover 21 and bottom plate 22. Extending through cover 21 and into cavity 24 is a set of contact pins 25 and 26 held in place by an electrically isolating filler 28, such as glass or the like. Mounted on beam 23 and extending upwardly into cavity 24 is a mass 27. Mass 27 is disposed such that when switch 10 contacts a foreign object, beam 23 will flex and, if the force is great enough, mass 27 will contact pins 25 and 26. It should be noted that mass 27 may be replaced or used in conjunction with various objects such as a piezoelectric crystal or the like. In addition, should flexible beam 23 be of sufficient weight, mass 27 may be eliminated and beam 23 allowed to contact pins 25 and 26.

This arrangement has pin 25 coupled to one end (+) of switch 20 and pin 26 to the other end (−). Since pins 25 and 26 are electrically isolated from each other by filler 28 no epoxy is required between beam 23 and cover 21 or bottom 22 to isolate beam 23. This allows for a hermetic seal and prevents the contacts of pins 25 and 26 from corroding making a more reliable switch. The hermetic sealing further prevents damage from exterior atmospheric conditions such as humidity.

Thus, it is apparent that it has been provided in accordance with the invention, a device that fully satisfies the objects, aims and advantages set forth above.

It has been shown that the present invention provides a hermetically sealed impact switch that is not suspectible to corrosion.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A hermetically sealed impact switch having an electrical input and an electrical output, said hermetically sealed impact switch comprising:

an insulative center plate having an opening disposed therethrough;

an insulative beam having a first end and a second end opposite said first end, said insulative beam being disposed in the opening of said insulative center plate and said first and second ends being coupled to said insulative center plate;

a conductive mass being coupled to said insulative beam;

an insulative top plate having a groove disposed therein, said insulative top plate being coupled to said insulative center plate such that the groove of said insulative top plate is disposed above the opening of said insulative center plate;

a first conductive contact pin being disposed through said insulative top plate and into the groove of said insulative top plate, said first conductive pin being coupled to one of said electrical input and electrical output of said hermetically sealed impact switch; and a second conductive contact pin being disposed through said insulative top plate and into said groove of said insulative top plate such that when said insulative beam flexes said first and second conductive contact pins are coupled by said conductive mass, said second conductive pin being coupled to a remaining one of said electrical input and electrical output of said hermetically sealed impact switch.

* * * * *